(12) United States Patent
Mak et al.

(10) Patent No.: US 6,757,209 B2
(45) Date of Patent: Jun. 29, 2004

(54) MEMORY CELL STRUCTURAL TEST

(75) Inventors: Tak M. Mak, Union City, CA (US);
Michael R. Spica, Hillsboro, OR (US);
Michael J. Tripp, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,642

(22) Filed: Mar. 30, 2001

(65) Prior Publication Data

US 2002/0141259 A1 Oct. 3, 2002

(51) Int. Cl.[7] ............... G11C 8/00; G11C 7/00
(52) U.S. Cl. ............... 365/230.02; 365/189.02; 365/230.06
(58) Field of Search ............ 365/189.07, 192.02, 365/230.02, 230.06, 230.08, 189.05, 189.04

(56) References Cited

U.S. PATENT DOCUMENTS

| | | | |
|---|---|---|---|
| 4,503,536 A | | 3/1985 | Panzer |
| 4,527,272 A | | 7/1985 | Reiney |
| 5,216,673 A | * | 6/1993 | Kanai ................ 714/719 |
| 5,708,598 A | * | 1/1998 | Saito ................. 365/149 |
| 5,894,445 A | | 4/1999 | Kobayashi |
| 5,973,967 A | * | 10/1999 | Nguyen et al. ....... 365/189.05 |
| 6,002,623 A | * | 12/1999 | Stave et al. ........ 365/190 |
| 6,064,601 A | | 5/2000 | Yoo et al. |
| 6,064,605 A | * | 5/2000 | Muranaka et al. ..... 365/189.01 |
| 6,233,193 B1 | * | 5/2001 | Holland et al. ...... 365/149 |
| 6,353,568 B1 | * | 3/2002 | Sung ................. 365/207 |

FOREIGN PATENT DOCUMENTS

DE 199 08 513 A 1 2/1998

* cited by examiner

Primary Examiner—Thong Q. Le
(74) Attorney, Agent, or Firm—Benjamin D. Burge

(57) ABSTRACT

An apparatus and method for testing memory cells comprising coupling a first and a second memory cell to a first and a second bit lines, respectively, reading data from the first and second memory cells through the first and second bit lines, and comparing the voltage levels of the first and second bit lines.

22 Claims, 7 Drawing Sheets

MEMORY CELL STRUCTURAL TEST

FIELD OF THE INVENTION

The present invention is related to the use of structural testing techniques to speed the testing of a memory array beyond what is possible with conventional functional tests.

ART BACKGROUND

As memory arrays commonly used in many electronic devices become increasingly larger and more densely packed, the test complexity increases exponentially, and so does the time required to thoroughly test the individual cells and other memory array components. As a result, manufacturing test processes take increasing longer to complete, as do efforts to debug the faults that are found.

Common practice within the art is to make use of functional tests wherein various combinations of values are written to and read back from memory cells within a memory array. However, as both the rows and columns of memory cells within memory arrays continue to increase in size, the number of write and read operations required to adequately test the memory cells increases exponentially, and causes a corresponding exponential increase in the amount of time required to carry out such tests. This has prompted questions about engaging in making increasing tradeoffs between manufacturing throughput of parts and thoroughness of test coverage, increasing the likelihood that faulty memory arrays will be passed on to customers.

Such functional tests also do not provide much in the way of information needed to trace the source of the failure. In essence, when it is found that a cell has returned a value other than what was last written to it, this result doesn't not provide an indication as to whether it was an address decoder fault, a data latch fault, a data line fault, a memory cell fault or a driver fault. Therefore, further tests are needed to isolate the fault within the memory array so that subsequent manufacturing yields may be improved, and as memory arrays continue to increase in size, the length of time required to perform these additional tests also increases.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

The present invention concerns memory arrays in which there exists an array of memory cells organized in rows and columns, wherein the memory cells are dynamically and randomly accessible, as in the case of commonly available DRAM and SRAM ICs. However, as those skilled in the art will appreciate, the present invention is also applicable to arrays of other circuits, including but not limited to, erasable ROM ICs, programmable logic devices and components organized into arrays within microprocessors.

Figure 1:
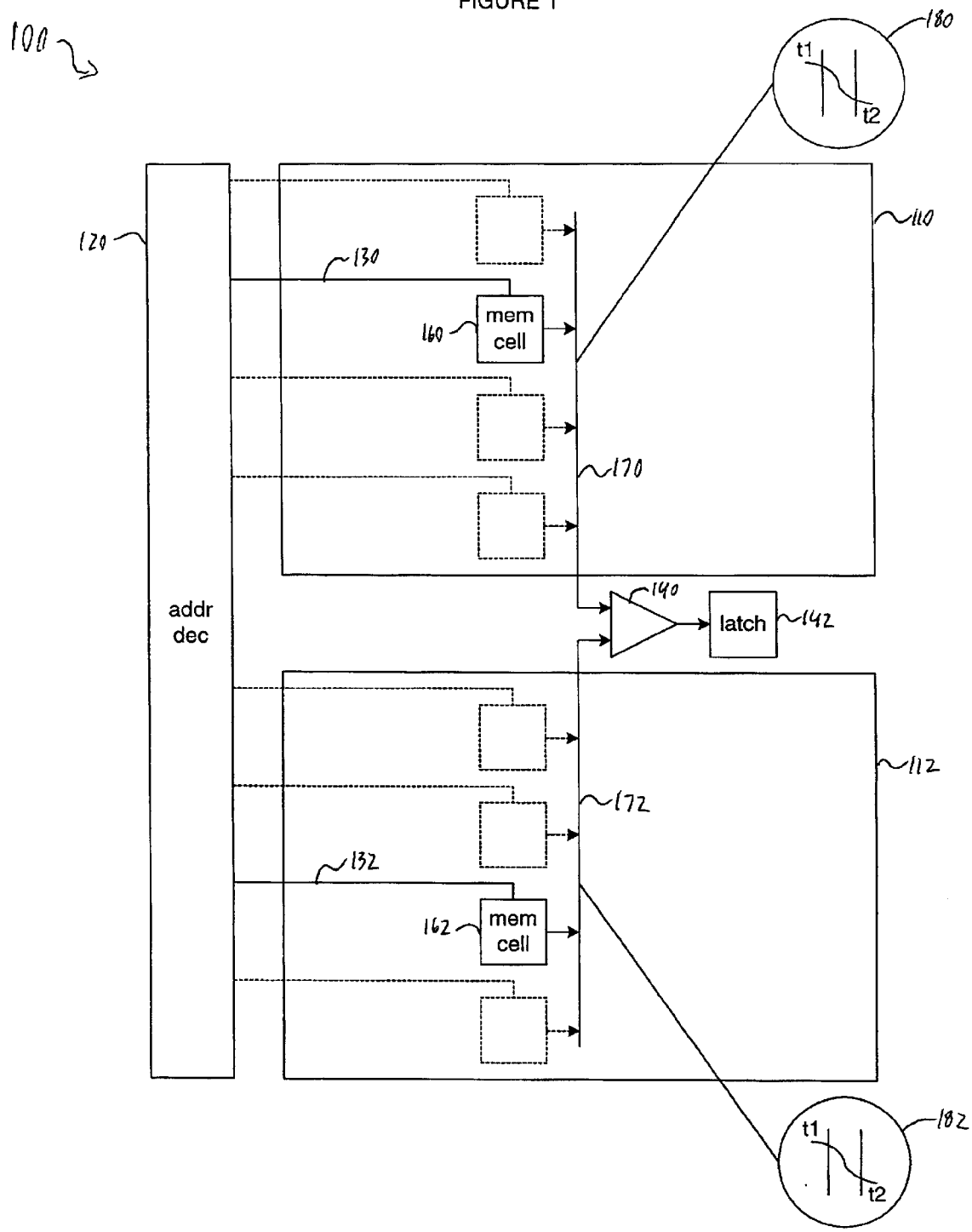
FIG. 1 is a block diagram of one embodiment of the present invention.

FIG. 1 is a block diagram of one embodiment of the present invention. Memory array 100 is depicted as comprised of top half 110, bottom half 112, address decoder 120 connected to both top half 110 and bottom half 112 via a plurality of word lines (including word lines 130 and 132), comparator circuit 140, and latch 142. Within top half 110 and bottom half 112 are memory cells 160 and 162, respectively, connected to bit lines 170 and 172, respectively. Bit lines 170 and 172 are in turn connected to the inputs of comparator circuit 140, which is in turn connected to latch 142. For purposes of clarity in discussing of the present invention, only memory cell 160 and bit line 170 are shown in top half 100, and only memory cell 162 and bit line 172 are shown in bottom half 112. However, as known by those skilled in the art, a typical memory array will have many bit lines, each of which will have many memory cells connected to it.

During normal operation of memory array 100, address decoder 120 decodes part of a memory address and turns on appropriate ones of the word lines connecting address decoder 120 with top half 110 and bottom half 112 to enable access to appropriate memory cells within top half 110 and bottom half 112. Depending on the memory operation being performed, data is either written to or read from memory cells in top half 110 and bottom half 112 via the bit lines to which they are connected. For example, during a write operation to a memory address associated with both memory cells 160 and 162, address decoder 120 decodes part of the memory address and turns on word lines 130 and 132 to enable access to memory cells 160 and 162 through bit lines 170 and 172, respectively.

In one embodiment of the present invention, memory cells 160 and 162 are tested by first writing identical data to each of memory cells 160 and 162 through bit lines 170 and 172, respectively. Bit lines 170 and 172 are then precharged to either a high voltage state or a low voltage state, commonly referred to as Vcc or Vss, respectively. Address decoder 120 then decodes part of a memory address associated with memory cells 160 and 162. Memory cells 160 and 162 then output their data onto bit lines 170 and 172, respectively. Comparator circuit 140 is a single comparator that continuously compares the voltages on bit lines 170 and 172, and continuously generates a signal indicating whether or not the voltages on bit lines 170 and 172 are substantially similar. In one embodiment, latch 142 may be triggered at one or more predetermined times during the test to capture the state of the output of comparator circuit 140 at such times, such as example times t1 and t2 during the progress of example waveforms 180 and 182 showing sample high-to-low transitions on bit lines 170 and 172, respectively. In another embodiment, latch 142 could be implemented as a "sticky latch" that latches and stores any occurrence of a signal from comparator circuit 140 indicating that the voltages on bit lines 170 and 172 became substantially different.

It is common practice when reading memory cells during normal use of a memory array to precharge the bit lines to a high voltage state. Therefore, in one embodiment of the present invention, the testing of the memory cells would be carried out with the bit lines being charged only to a high state when reading the memory cells. However, due to commonly used memory cell designs, limiting precharging to only a high state would result in as much as half of the circuitry of a memory cell not being tested for excessive leakage or other conditions. Therefore, another embodiment of the present invention would entail testing with the bit lines precharged to both high and low states.

The use of comparator circuit 140 to test memory cells 160 and 162 is based on the assumption that identically designed memory cells connected to identically designed bit lines should be able to drive the voltages of their associated bit lines either high or low at a substantially similar rate. In short, the waveforms seen on both bit lines 170 and 172 (such as example waveforms 180 and 182) should look substantially similar. This use of a comparator circuit is also based on the assumption of it being highly unlikely that a process variation or other defect in memory array 100 will result in identical faults to both top half 110 and bottom half 112, and so it is highly unlikely that both memory cells 160 and 162 will be defective in ways similar enough that the resulting errant waveforms seen on bit lines 170 and 172 will look substantially the same. In other words, it is presumed that an impurity, such as a dust particle or a fabrication process error, will not have identical effects on both top half 110 and bottom half 112 such that tests carried out in accordance with the present invention will reveal no differences between any pair of memory cells between top half 110 and bottom half 112.

Memory array 100 is shown as split into top half 110 and bottom half 112 in accordance with a common practice known to those skilled in the art so that buffers and other associated circuitry may be centrally located, and allowing the bit lines to be kept short to give the bit lines more desirable electrical characteristics. The present invention takes advantage of this common practice to make use of the same central location provided to centrally locate comparator circuits, such as comparator 140, to compare the electrical characteristics of adjacent bit lines. However, as will also be clear to those skilled in the art, this split of memory array 100 into top half 110 and bottom half 112 is not necessary to the practice of the present invention. The present invention may be practiced with numerous other layouts or placements of the components comprising a memory array.

Figure 2A:
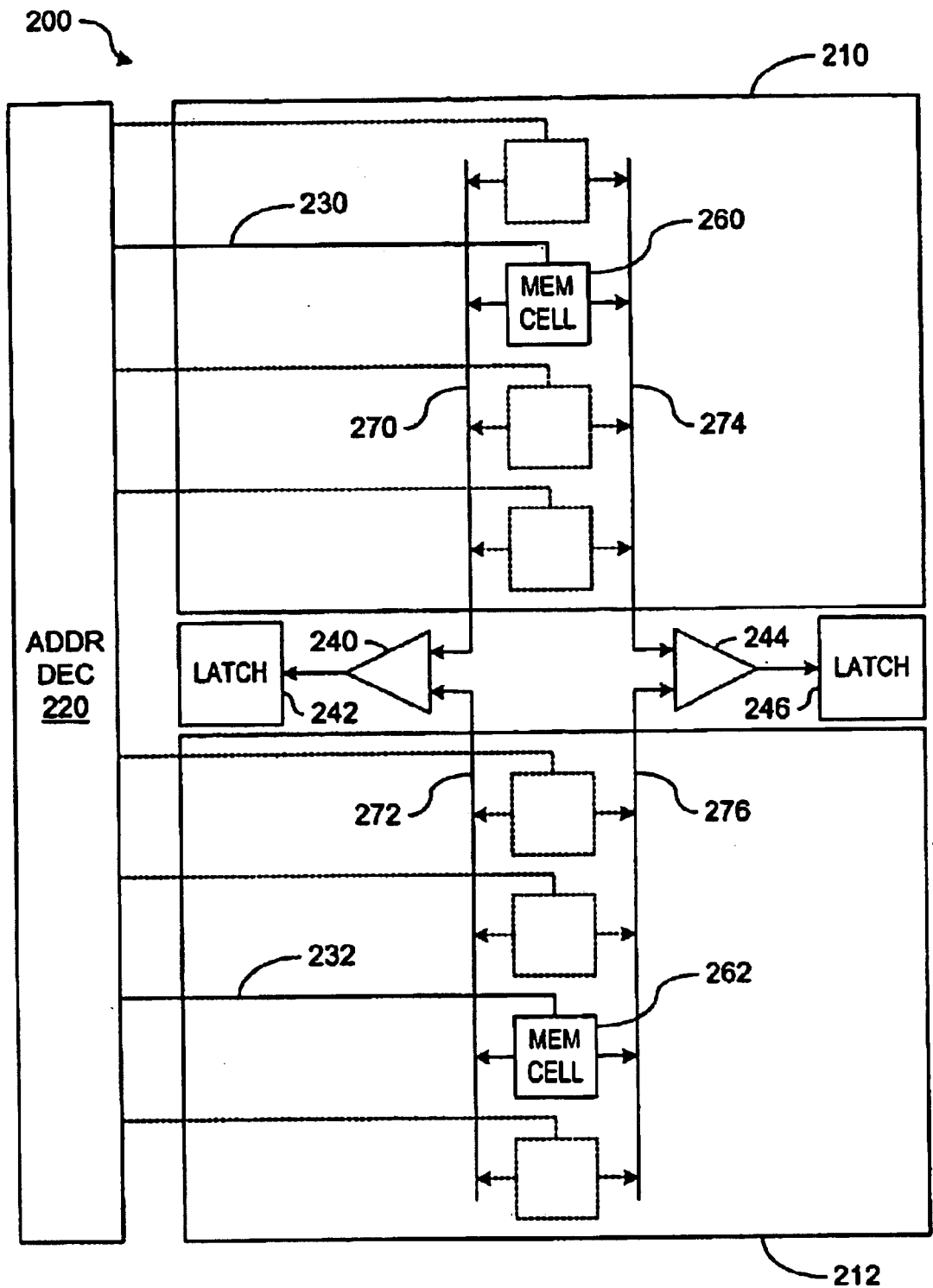
FIGS. 2a and 2b are block diagrams of another embodiment of the present invention.
Figure 2B:
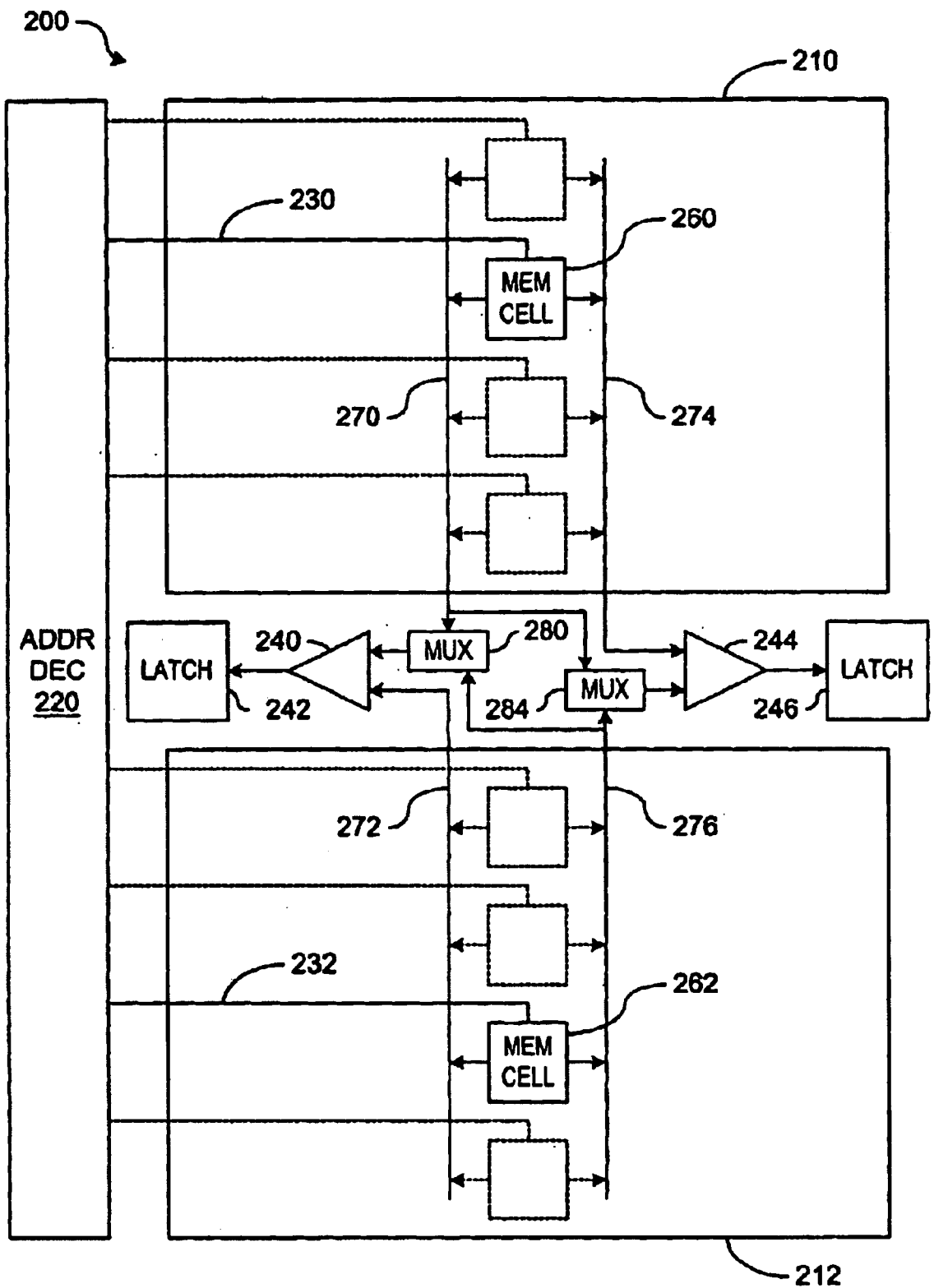

FIGS. 2a and 2b are block diagrams of other embodiments of the present invention. Memory array 200 is substantially similar to memory array 100 of FIG. 1, and items numbered with 2xx numbers in FIGS. 2a and 2b are meant to correspond to items numbered with 1xx numbers in FIG. 1. In a manner corresponding to memory array 100, memory array 200 is comprised of address decoder 220, coupled to memory cell 260 within top half 210 by word line 230, and coupled to memory cell 262 within bottom half 212 by word line 232.

However, unlike memory cells 160 and 162, which were each connected to only one bit line, memory cells 260 and 262 are each connected to a pair of bit lines (bit lines 270 and 274, and bit lines 272 and 276, respectively). In one embodiment, pairs of bit lines are used with each memory cell to write and read both a bit of data and its compliment to and from each memory cell. In this embodiment, it would be common practice to route each pair of bit lines to a pair of differential inputs on sense amplifiers for reading a bit of data and its compliment. However, in an alternate embodiment, two (or more) bit lines are used to provide two (or more) entirely independent routes by which data may be written to or read from each memory cell. This use of the bit lines in this alternate embodiment would often reflects the way in which a multiple port memory component is often implemented.

Regardless of the purpose for having a pair of bit lines connected to each of memory cells 260 and 262, in a manner that corresponds to bit lines 170 and 172 of memory array 100 of FIG. 1, in FIG. 2a, bit lines 270 and 272 are connected to the inputs of comparator circuit 240, and bit lines 274 and 276 are connected to the inputs of comparator circuit 244. Also corresponding to FIG. 1, the outputs of comparator circuits 240 and 244 are connected to latches 242 and 246.

In an embodiment of the present invention where memory cells are written to and read from using pairs of bit lines that carry data and its compliment, memory cells 260 and 262 are tested by first writing identical data to each of memory cells 260 and 262 through bit lines 270 and 274, and bit lines 272 and 276, respectively. Bit lines 270 through 276 are then precharged to either a high voltage state or a low voltage state. Address decoder 220 then decodes part of a memory address associated with memory cells 260 and 262. Memory cells 260 and 262 then output their data onto bit lines 270 and 274, and bit lines 272 and 276, respectively. Comparator circuit 240 is a single comparator that continuously compares the voltages on bit lines 270 and 272, and continuously generates a signal indicating whether or not the voltages on bit lines 270 and 272 are substantially similar. Comparator circuit 244 does the same with the voltages on bit lines 274 and 276. In one embodiment, latches 242 and 246 may be triggered at one or more predetermined times during the test to capture the state of the output of comparator circuits 240 and 244 at those times. In another embodiment, latches 242 and 246 could each be implemented as a "sticky latch" that latches and stores any occurrence of a signal from the comparator circuits to which they are connected indicating that voltages on their associated bit lines became substantially different.

Furthermore, in an embodiment where memory cells are written to and read from using pairs of bit lines to carry data and its complement and sense amplifiers are used in reading from memory cells, the sense amplifiers could also be configured to serve as the comparators used as the comparator circuits to test the memory cells. This could be accomplished through the use of multiplexers to selectively connect and disconnect different ones of the bit lines as needed to allow the sense amplifiers to perform one or the other of these two functions as depicted by the use of multiplexers 280 and 284 in FIG. 2b to selectively couple either one or the other of bit lines 270 or 276 to one input on each of comparators 240 and 244, respectively. Otherwise, in an alternate embodiment, the sense amplifiers and the comparators could remain separate components.

In an alternate embodiment of the present invention where memory cells may be independently written to or read from using either of the bit lines attached to each of the memory cells, as in the case of a multiple port memory, the memory cells are tested in much the same manner just described. However, to ensure that the function of writing memory cells 260 and 262 is free of defects, the testing of each of memory cells 260 and 262 would be carried out twice, first using bit lines 270 and 272 to write identical data to memory cells 260 and 262, respectively, and then again using bit lines 274 and 276.

Figure 3:
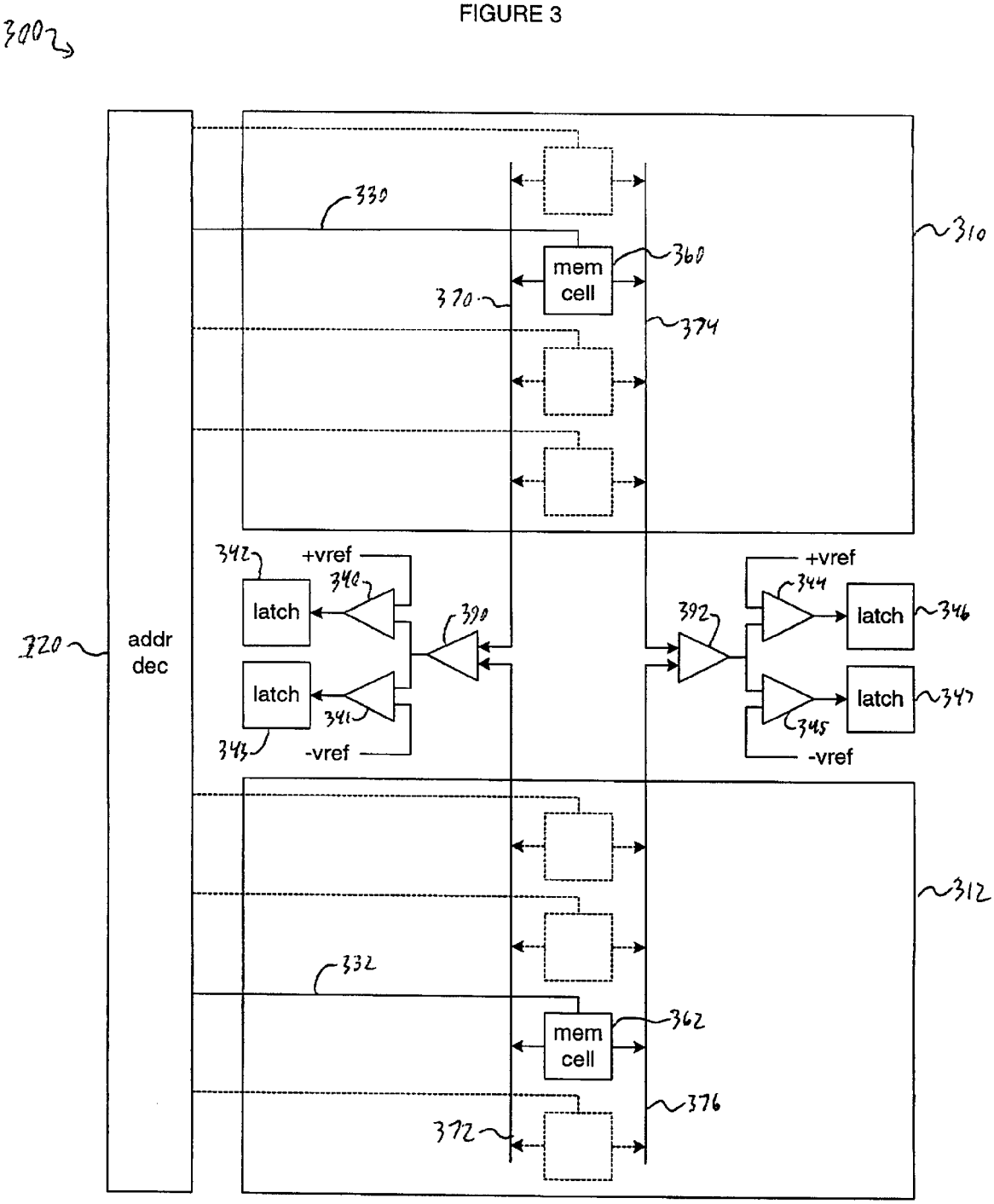
FIG. 3 is a block diagram of still another embodiment of the present invention.

FIG. 3 is a block diagram of yet another embodiment of the present invention. Memory array 300 is substantially similar to memory array 200 of FIGS. 2a and 2b, and items numbered with 3xx numbers in FIG. 3 are meant to correspond to items numbered with 2xx numbers in FIGS. 2a and 2b, with exception of the comparator circuits and their associated latches. In a manner corresponding to memory array 200, memory array 300 is comprised of address decoder 320, coupled to memory cell 360 within top half 310 by word line 330, and coupled to memory cell 362 within bottom half 312 by word line 332. Also in a manner corresponding to memory array 200, memory cell 360 is coupled to bit lines 370 and 374, and memory cell 362 is coupled to bit lines 372 and 376.

Unlike the embodiments depicted in FIGS. 2a and 2b, the comparator circuits of FIG. 3 are each comprised of a subtracting circuit and a pair of comparators. Bit lines 370 and 372 are connected to the inputs of subtracting circuit 390. Subtracting circuits 390 subtracts the voltage level of one of bit lines 370 from the voltage level of the other of bit lines 372, and outputs a voltage that represents the difference resulting from the subtraction, which could be either a positive or negative voltage output. This output of subtracting circuit 390 is, in turn, connected to one of the two inputs on each of comparators 340 and 341. Correspondingly, bit lines 374 and 376 are connected to the inputs of subtracting circuit 392, and the output of subtracting circuit 392 is connected to one of the two inputs on each of comparators 344 and 345. The other input on each of comparators 340 and 344 are connected to a high voltage level reference, +vref, and correspondingly, the other input on each of comparators 341 and 345 are connected to a low voltage reference, −vref. The outputs of comparators 340, 341, 344 and 345 are connected to the inputs of latches 342, 343, 346 and 347, respectively.

Regardless of whether the memory cells of memory array 300 are written to and read from with a pair of bit lines, or each of the two bit lines connected to each cell are meant to be used to perform independent read and write operations, the testing of memory cells 360 and 362 of memory array 300 is carried out in much the same way as was described above for memory cells 260 and 262 in FIGS. 2a and 2b. However, the configuration of comparator circuits that are each comprised of a subtracting circuit and a pair of comparators as shown in FIG. 3 affords greater ability to control the degree to which the voltages on pairs of bit lines that are being compared may differ from each other. More precisely, by adjusting +vref and −vref, comparators 340 and 344 can be biased to allow the voltage levels on bit lines 370 and 372 to differ to a degree that is adjustable before either comparator 340 or 344 outputs a signal indicating a malfunction. If the difference in voltage levels between bit lines 370 and 372 is such that it rises above +vref, then comparator 340 will output a signal indicating so to latch 342, and if the difference in voltages levels between bit lines 370 and 372 is such that it drops below −vref, then comparator 344 will output a signal indicating so to latch 346.

Figure 4:
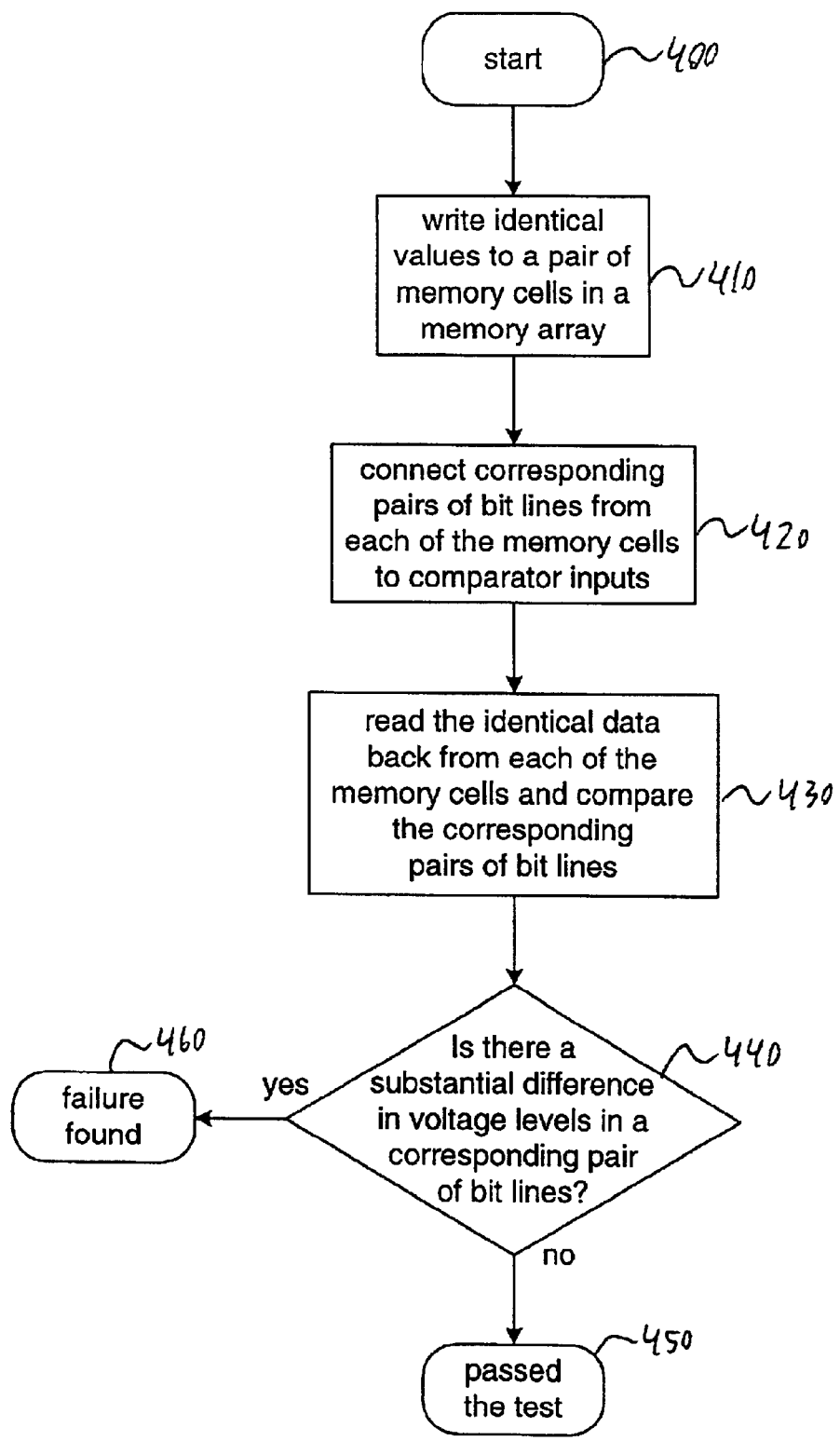
FIG. 4 is a flow chart of one embodiment of the present invention.

FIG. 4 is a flow chart of one embodiment of the present invention. Starting at 400, identical values are written to a pair of memory cells in a memory array at 410. At 420, corresponding pairs of bit lines from each of the two memory cells are connected to the inputs of a comparator circuit. In one embodiment, where each memory cell is connected to only one bit line, this would mean that each of the two bit lines would be connected to the inputs of a single comparator circuit at 420. Alternatively, in another embodiment where each memory cell is connected to two bit lines, then each bit line from one memory cell is connected to a comparator circuit along with a corresponding bit line from the other memory cell at 420.

At 430, the identical values are read back from each of the pair of memory cells, and each corresponding pair of bit lines connected to a comparator circuit are compared. If the voltage levels differ substantially between a corresponding pair of bit lines, then a failure is found at 460. However, if there are no substantially differing voltage levels between corresponding pairs of bit lines, then this test of the pair of memory cells and the bit lines to which they are connected passes at 450.

Figure 5:
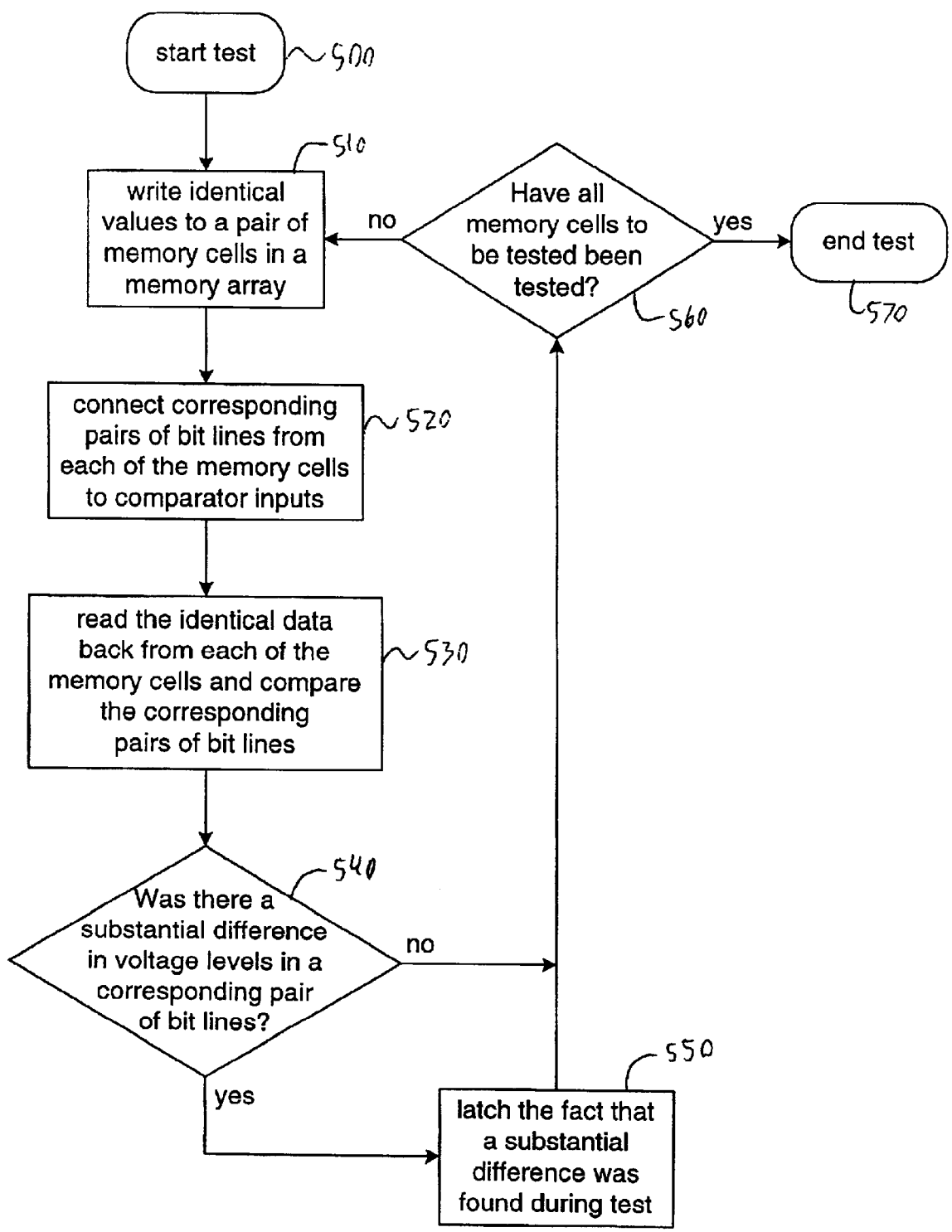
FIG. 5 is a flow chart of another embodiment of the present invention.

FIG. 5 is a flow chart of another embodiment of the present invention. The testing of memory cells in a memory array starts at 500. At 510, identical values are written to a pair of memory cells in a memory array, and at 520, corresponding pairs of bit lines coupled to each memory cell in the pair of memory cells are connected to the inputs of a comparator circuit. Then, at 530, the identical values are read back from the pair of memory cells, and the voltage levels of the corresponding pairs of bit lines are compared. If, at 540, a substantial difference is found in the voltage levels in a corresponding pair of bit lines, then the fact that a substantial difference was found is latched at 550, However, regardless of whether such a substantial difference was found at 540, the test ends if there are no more memory cells to be tested at 560. Otherwise, the test is repeated for another pair of memory cells at 510.

By way of one example, referring variously to both FIGS. 1 and 5, at 510, identical values are written to memory cells 160 and 162, using bit lines 170 and 172, respectively. At 520, bit lines 170 and 172 are connected to the inputs of comparator circuit 140. At 530, the identical data written to both memory cells 160 and 162 is read back from memory cells 160 and 162, using bit lines 170 and 172, respectively, and the voltage levels on bit lines 170 and 172 are compared using comparator circuit 140. If comparator circuit 140 detects a substantial difference in voltage between bit lines 170 and 172, then an indication of this fact is latched by latch 142. If, at 560, more memory cells are to be tested, then at 510, another pair of identical values are written to another pair of memory cells. Alternatively, the test may be repeated for memory cells 160 and 162, with bit lines 170 and 172 being pre-charged to a high state for one test of reading back the identical data, and then being pre-charged to a low state for another reading back of the identical data.

By way of another example, referring variously to both FIGS. 2 and 5, where memory cells 260 and 262 are written to and read from with pairs of bit lines, and specifically, where bit lines 270 and 272 are used to write and read data, while bit lines 274 and 276 are used to write and read the compliments of the data. At 510, identical values are written to memory cells 260 and 262, using bit lines 270 and 272 to write identical data to memory cells 260 and 262, respectively, while bit lines 274 and 276 are used to write identical compliment data to memory cells 260 and 262, respectively. At 520, bit lines 270 and 272 are connected to the inputs of comparator circuit 240, and bit lines 274 and 276 are connected to the inputs of comparator circuit 244. At 530, the identical data and compliments written to both memory cells 260 and 262 is read back using bit lines 270 and 274 to read back from memory cell 260, and bit lines 272 and 276 to read back from memory cell 262. If comparator circuit 240 detects a substantial difference in voltage between bit lines 270 and 272 while reading back the data, then an indication of this fact is latched by latch 242.

Correspondingly, if comparator circuit 244 detects a substantial difference in voltage between bit lines 274 and 276 while reading back compliment data, then an indication of this fact is latched by latch 244. If, at 560, more memory cells are to be tested, then at 510, another pair of identical values are written to another pair of memory cells. Alternatively, the test may be repeated for memory cells 260 and 262, with bit lines 270, 272, 274 and 276 being pre-charged to a high state for one test, and then being pre-charged to a low state for the other test.

Figure 6:
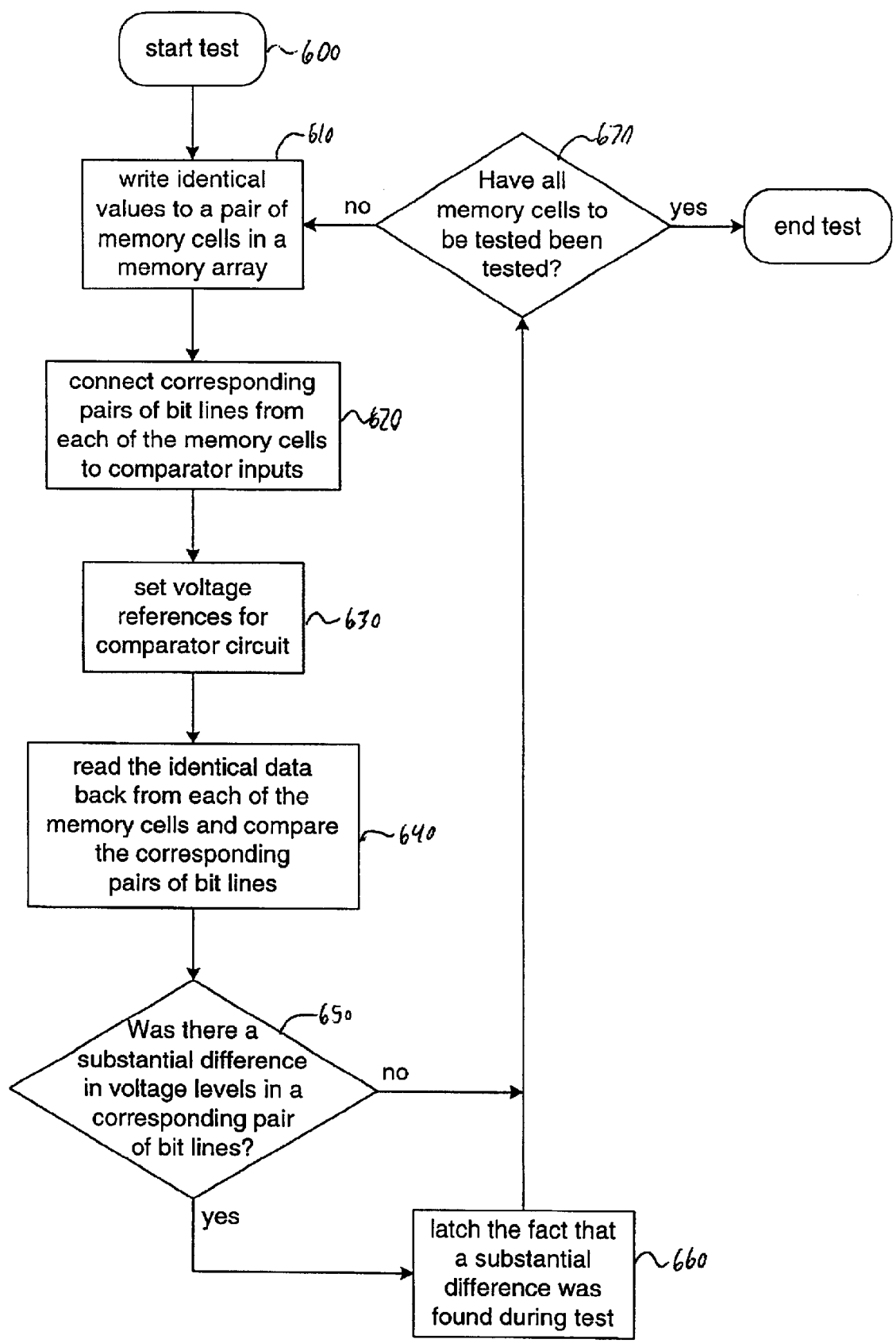
FIG. 6 is a flow chart of still another embodiment of the present invention.

FIG. 6 is a flow chart of still another embodiment of the present invention. The testing of memory cells using pairs of bit lines to read and write both bits of data and their compliments in a memory array starts at 600. At 610, identical values are written to a pair of memory cells in a memory array, and at 620, corresponding ones of bit lines for data and complimentary data that are coupled to each memory cell in the pair of memory cells are connected to the inputs of comparator circuits. Then, at 630, voltage references used by the comparator circuits are set. At 640, the identical values are read back from the pair of memory cells, and the voltage levels of the corresponding pairs of bit lines for data and their compliments are compared. If, at 650, a substantial difference is found in the voltage levels in a corresponding pair of bit lines, then the fact that a substantial difference was found is latched at 660, However, regardless of whether such a substantial difference was found at 650, the test ends if there are no more memory cells to be tested at 670. Otherwise, the test is repeated for another pair of memory cells at 610. Alternatively, the test may also be repeated if it is desired to test the bit lines with both a high and a low pre-charging during the reading back of the identical data.

By way of example, referring variously to both FIGS. 3 and 6, where memory cells 360 and 362 are written to and read from with pairs of bit lines, and specifically, where bit lines 370 and 372 are used to write and read data, while bit lines 374 and 376 are used to write and read the compliments of the data. At 610, identical values are written to memory cells 360 and 362, using bit lines 370 and 372 to write identical data to memory cells 360 and 362, respectively, while bit lines 374 and 376 are used to write identical compliment data to memory cells 360 and 362, respectively. At 620, bit lines 370 and 372 are connected to the inputs of subtracting circuit 390, which together with comparators 340 and 341, comprise a comparator circuit. Correspondingly, bit lines 374 and 376 are connected to the inputs of subtracting circuit 392, which together with comparators 344 and 345, also comprise a comparator circuit. At 630, voltage reference +vref, which is coupled to inputs of comparators 340 and 341, and voltage reference −vref, which is coupled to inputs of comparators 344 and 345, are both set. At 640, the identical data and compliments of that data earlier written to both memory cells 360 and 362 is read back, using bit lines 370 and 374 to read back from memory cell 360, and bit lines 372 and 376 to read back from memory cell 262. At 650, if a substantial difference was found in the voltage levels of corresponding pairs of bit lines 370 and 372 or bit lines 374 and 376, then at 660, the occurrence of this is latched by the appropriate one of latches 342, 343, 346 or 347.

More specifically, subtractor circuit 390 subtracts the voltage on bit line 370 from bit line 372, and outputs a voltage representing the resulting difference to the inputs of both comparators 340 and 341. If there is a difference in the voltage levels between bit lines 370 and 372, then the output of subtractor circuit 390 will be a non-zero voltage level that will be either negative or positive depending on which of bit lines 370 or 372 have the higher voltage level. Comparator 340 compares this output from subtracting circuit 390, if the voltage level of the output is higher than +vref, then an indication that this is so is latched by latch 342. Similarly, comparator 341 compares the output from subtracting circuit 390, and if the voltage level of the output is lower than −vref, then an indication that this is so is latched by latch 343. Correspondingly, subtracting circuit 392 provides an output representing the difference between the voltage levels of bit lines 374 and 376 to the inputs of comparators 344 and 345, which in turn, compare this output to +vref and −vref, respectively, and any indication that the voltage level of this output has risen above +vref or dropped below −vref is latched by latches 346 and 347, respectively.

If, at 670, more memory cells are to be tested, then at 610, another pair of identical values are written to another pair of memory cells. Alternatively, the test may be repeated for memory cells 360 and 362, with bit lines 370, 372, 374 and 376 being pre-charged to a high state for one test, and then being precharged to a low state for the other test.

The invention has been described in conjunction with the preferred embodiment. It is evident that numerous alternatives, modifications, variations and uses will be apparent to those skilled in the art in light of the foregoing description. It will be understood by those skilled in the art, that the present invention may be practiced in support of other functions in an electronic device.

The example embodiments of the present invention are described in the context of an array of memory cells accessible, in part, by bit lines. However, the present invention is applicable to a variety of electronic, microelectronic and micromechanical devices.

What is claimed is:

1. An apparatus, comprising:
   a first memory cell coupled to a first bit line and a second bit line;
   a second memory cell coupled to a third bit line and a fourth bit line;
   an address decoder coupled to the first and second memory cells to enable access to the first and second memory cells;
   a first comparator circuit coupled to the first and third bit lines to compare a voltage level on the first bit line with a voltage level on the third bit line at a time when data is output from the first memory cell on the first bit line and from the second memory cell on the third bit line; and
   a second comparator circuit coupled to the second and fourth bit lines to compare a voltage level on the second bit line with a voltage level on the fourth bit line at a time when the compliment of the data that is output on the first and third bit lines is output from the first memory cell on the second bit line and from the second memory cell on the fourth bit line.

2. The apparatus of claim 1, wherein the address decoder decodes part of a memory address.

3. The apparatus of claim 1, wherein the first and second memory cells are dynamic RAM memory cells.

4. The apparatus of claim 1, wherein the first and second memory cells are static RAM memory cells.

5. The apparatus of claim 1, wherein the first comparator circuit is comprised of a single comparator with a first input coupled to the first bit line and a second input coupled to the third bit line, and wherein the second comparator circuit is comprised of a single comparator with a first input coupled to the second bit line and a second input coupled to the fourth bit line.

6. The apparatus of claim 5, wherein the output of the first comparator is coupled to a first latch to store an indication that the voltage level on the first bit line differs substantially from the voltage level on the third bit line, and wherein the output of the second comparator is coupled to a second latch to store an indication that the voltage level on the second bit line differs substantially from the voltage level on the fourth bit line.

7. The apparatus of claim 6, wherein the time at which the first and second latches are triggered is adjustable.

8. The apparatus of claim 6, wherein the first latch is a sticky latch that is triggered to latch an indication that the voltage level on the first bit line differs substantially from the voltage level on the third bit line, and wherein the second latch us a sticky latch that is triggered to latch an indication that the voltage on the third bit line differs substantially from the voltage on the fourth bit line.

9. The apparatus of claim 1, wherein the first and second comparator circuits are each comprised of:
 a subtracting circuit with a first input coupled to the first bit line and a second input coupled to the second bit line;
 a first comparator coupled to the output of the subtracting circuit; and
 a second comparator coupled to the output of the subtracting circuit.

10. The apparatus of claim 9, wherein:
 the output of the first comparator is coupled to a first latch to store an indication that difference in voltage levels between the first bit line and the second bit line has risen above a first reference voltage; and
 the output of the second comparator is coupled to a second latch to store an indication that the difference in voltage levels between the first bit line and the second bit line has dropped below a second reference voltage.

11. The apparatus of claim 10, wherein the first and second reference voltages are adjustable.

12. The apparatus of claim 10, wherein the time at which the first and second latches are triggered is adjustable.

13. The apparatus of claim 10, wherein the first and second latches are sticky latches such that the first latch will latch any indication that the differences in voltage level between the first and second bit lines has risen above the first voltage reference and the second latch will latch any indication that the differences in voltage level between the first and second bit lines has dropped below the second reference voltage.

14. A method, comprising:
 writing identical values to the first and second memory cells;
 coupling a first memory cell to a first bit line;
 coupling the first memory cell to a second bit line;
 coupling a second memory cell to a third bit line;
 coupling the second memory cell to a fourth bit line;
 coupling the first and third bit lines to inputs of a first comparator circuit;
 coupling the second and fourth bit lines to inputs of a second comparator circuit;
 reading the identical values from the first memory cell through the first bit line and from the second memory cell through the third bit line;
 reading the identical values from the first memory cell through the second bit line and from the second memory cell through the fourth bit line that are compliments of the values read through the first and third bit lines;
 comparing the voltage levels on the first and third bit lines; and
 comparing the voltage levels on the second and fourth bit lines.

15. The method of claim 14, further comprising latching an indication from the first comparator circuit of whether or not the voltage level of the first bit line differs substantially from the voltage level of the third bit line, and latching an indication from the second comparator circuit of whether or not the voltage level of the second bit line differs substantially from the voltage level of the fourth bit line.

16. The method of claim 14, further comprising setting the degree to which the difference in voltage levels between the first bit line, and the third bit line, and between the second bit line and the fourth bit line are substantial.

17. An apparatus comprising:
 a first bit line coupled to a first memory cell in a memory array;
 a second bit line coupled to a second memory cell in the memory array;
 a third bit line coupled to the first memory cell in the memory array;
 a multiplexer coupled to both the second and third bit lines; and
 a comparator having a first input coupled to the first bit line, and a second input coupled to the multiplexer to be selectively coupled to either the second or third bit line as selected by the multiplexer.

18. The apparatus of claim 17, wherein the first and second memory cells are dynamic RAM memory cells.

19. The apparatus of claim 17, wherein the first and second memory cells are static RAM memory cells.

20. The apparatus of claim 17, wherein the output of the comparator is coupled to a latch to store an indication that the voltage level on the first bit line differs substantially from the voltage level on the third bit line.

21. The apparatus of claim 20, wherein the time at which the latch is triggered is adjustable.

22. The apparatus of claim 20, wherein the latch is a sticky latch that is triggered to latch an indication that the voltage level on the first bit line differs substantially from the voltage level on the third bit line.

* * * * *

UNITED STATES PATENT AND TRADEMARK OFFICE
CERTIFICATE OF CORRECTION

PATENT NO. : 6,757,209 B2  Page 1 of 1
DATED : June 29, 2004
INVENTOR(S) : Mak et al.

It is certified that error appears in the above-identified patent and that said Letters Patent is hereby corrected as shown below:

Column 9,
Line 13, delete "us" and insert -- is --.

Signed and Sealed this

Twenty-third Day of November, 2004

JON W. DUDAS
*Director of the United States Patent and Trademark Office*